(12) United States Patent
Delpech et al.

(10) Patent No.: US 6,218,723 B1
(45) Date of Patent: Apr. 17, 2001

(54) INTEGRATED CAPACITOR WITH HIGH VOLTAGE LINEARITY AND LOW SERIES RESISTANCE

(75) Inventors: Philippe Delpech, Meylan; Etienne Robilliart, Lumbin; Didier Dutartre, Meylan, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/390,862

(22) Filed: Sep. 3, 1999

(30) Foreign Application Priority Data

Sep. 4, 1998 (FR) .................................................. 98 11221

(51) Int. Cl.⁷ .................................................. H01L 29/43
(52) U.S. Cl. .......................... 257/532; 257/756; 438/239
(58) Field of Search .................. 257/306–311, 532–535, 257/750–756; 438/250–256, 393–399, 666, 239

(56) References Cited

U.S. PATENT DOCUMENTS

| | | | |
|---|---|---|---|
| 5,343,062 | 8/1994 | Tomioka | 257/297 |
| 5,510,637 | * 4/1996 | Hsu et al. | 257/304 |
| 5,721,152 | * 2/1998 | Jeng et al. | 437/52 |
| 5,744,853 | 4/1998 | Quek et al. | 257/532 |
| 5,840,605 | * 11/1998 | Tuan | 438/253 |

FOREIGN PATENT DOCUMENTS 2 294 586   1/1996  (GB) .

* cited by examiner

*Primary Examiner*—David Hardy
(74) *Attorney, Agent, or Firm*—Theodore E. Galanthay; Allen, Dyer, Doppelt, Milbrath & Gilchrist, P.A.

(57) ABSTRACT

A capacitor integrated on a silicon substrate includes a first electrode made of highly doped polysilicon, a thin silicon oxide layer, a second electrode made of polysilicon and a silicide layer covering the second electrode. The second electrode has a high dopant concentration at its interface with the silicon oxide layer and a low or medium dopant concentration at its interface with the silicide layer.

35 Claims, 1 Drawing Sheet

INTEGRATED CAPACITOR WITH HIGH VOLTAGE LINEARITY AND LOW SERIES RESISTANCE

FIELD OF THE INVENTION

The present invention relates to the field of integrated circuits, and, more particularly, to an integrated circuit capacitor.

BACKGROUND OF THE INVENTION

It is common practice to make integrated circuits having one or more high capacitance capacitors. These integrated circuit capacitors advantageously replace conventional capacitors which are discrete components. Integrated circuit capacitors have various applications in the field of analog or RF circuits. For example, integrated circuit capacitors can be used for the filtering of supply voltages, the making of LC type antenna circuits, etc. Among known integrated circuit capacitors are polysilicon/oxide/polysilicon type capacitors providing various advantages, such as low series resistance, high value per surface unit, low variation as a function of temperature. In addition, these integrated circuit capacitor provides under certain conditions high linearity as a function of voltage, i.e., a substantially constant value regardless of the voltage applied.

FIG. 1 is a partial sectional view of a capacitor $C_0$ of the above-mentioned type integrated into a silicon chip. The capacitor has electrodes 1, 2 made of polysilicon separated by a thin layer 3 of silicon oxide. Polysilicon hereinafter designates polycrystalline silicon. The upper electrode 2 is covered with a silicide layer 4, which is generally a metal silicide such as titanium silicide $TiSi_2$. The upper electrode 2 is furthermore provided with an electrical contact 5, such as a metallized zone or a conductive track, for example. The capacitor $C_0$ is made on a thick silicon oxide layer 6 deposited on a silicon substrate 7. The thin oxide layer 3 has a small thickness, typically about 30 nanometers, and the electrodes 1, 2 have a thickness of about 200 to 300 nanometers. The electrodes 1, 2 are doped with arsenic or phosphorus, and thus have an N-type doping.

As is well known to those skilled in the art, polysilicon has a low electrical conductivity when highly doped. The layer of metal silicide 4, in contrast, has high conductivity and enables this drawback to be overcome. Thus, when there is no silicide treatment, a polysilicon/oxide/polysilicon integrated capacitor shows high series resistance which proves to be a problem in AC operation, especially in an LC resonant circuit wherein the circuit's Q factor it modified.

Furthermore, it is known that obtaining a capacitor with high voltage linearity requires that the electrodes should be highly doped, so that limits may be placed on the presence in the polysilicon of a depletion zone that counters the passage of the current. Thus, an ideal integrated circuit capacitor has highly doped silicon electrodes and a silicide layer on its upper electrode. A capacitor of this type has high voltage linearity and low series resistance.

The making of a capacitor of this type that has intensive doping of the upper electrode is incompatible with the process of applying silicide treatment to the electrode, which is done at a moderate temperature in the presence of a metal. This is because the dopant slows down the diffusion of silicon in the metal and may even block the entire process. Thus, it often happens that a highly doped polysilicon layer, after being subjected to silicide treatment, has zones that are entirely devoid of silicide. Furthermore, the dopant concentration in the upper electrode gets substantially diminished during the process of silicide treatment through the migration of dopants into the silicide layer under formation. Consequently, these various factors mean that a compromise is required for making a capacitor which has a medium doped upper electrode that is well suited to the silicide treatment process, but which has a voltage linearity that is not optimum.

SUMMARY OF THE INVENTION

An object of the present invention is to provide a capacitor that provides both optimum voltage linearity and minimum series resistance.

To achieve this object, the surface concentration of dopant is made independent of the polysilicon electrode. The dopant concentration at the interface with the silicon oxide dielectric is distinct from the dopant concentration on the surface to be given the silicide treatment. The integrated circuit capacitor is preferably integrated on a silicon substrate comprising a first electrode made of highly doped polysilicon, a thin silicon oxide layer, a second electrode made of polysilicon, and a silicide layer covering the second electrode. The second electrode preferably has a high dopant concentration at its interface with the silicon oxide and a low or medium dopant concentration at its interface with the silicide.

According to a first embodiment of an integrated circuit capacitor, the second electrode comprises at least two polysilicon layers that do not have the same dopant concentration. The second electrode comprises a first polysilicon layer that is highly doped and placed on the oxide side, and a second layer of weakly or medium doped polysilicon. Preferably, the first polysilicon layer has a dopant concentration in the range of $4E^{20}$ to $8E^{20}$ atoms/cm$^3$, and the second polysilicon layer has a dopant concentration in the range of $1E^{20}$ to $2E^{20}$ atoms/cm$^3$.

According to a second embodiment of an integrated circuit capacitor, the two polysilicon layers are separated by a thin metal layer. According to one alternative, the thin metal layer is a metal selected from the group comprising titanium, tungsten, cobalt and tantalum. According to another alternative, the thin metal layer comprises two thin layers of two different metals or alloys. Preferably, the thin metal layer comprises a layer of titanium and a layer of titanium nitride.

According to a third embodiment of an integrated circuit capacitor, the second electrode comprises a polysilicon layer having a profile of dopant concentration that decreases from its interface with the silicon oxide towards its interface with the silicide. Preferably, the dopant concentration of the second electrode is in the range of $4E^{20}$ to $8E^{20}$ atoms/cm$^3$ on the oxide side, and in the range of $1E^{20}$ to $2E^{20}$ atoms/cm$^3$ on the silicide layer side.

During the making of an integrated circuit capacitor according to the invention, it is preferable that the silicide layer covering the second electrode is formed of a metal selected from the group consisting of titanium, tungsten, cobalt and tantalum.

BRIEF DESCRIPTION OF THE DRAWINGS

These characteristics of the present invention will be explained in greater detail in the following description of three embodiments of integrated circuit capacitors according to the invention with reference to the appended drawings, of which.

DETAILED DESCRIPTION OF THE PREFERRED EMBODIMENTS

Figure 1:
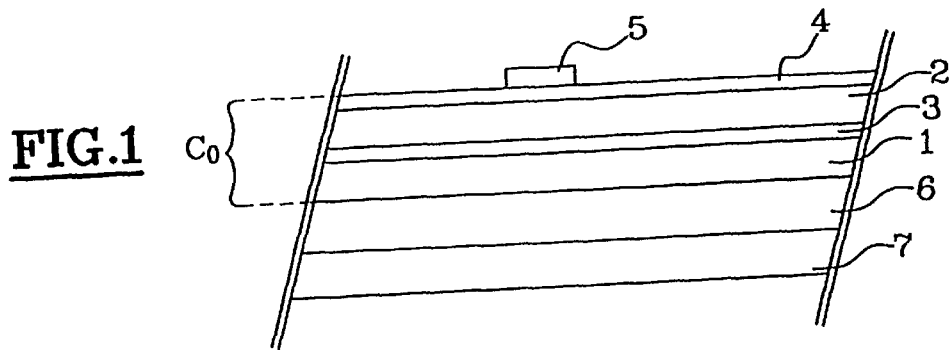
FIG. 1 is a cross-sectional view of an integrated capacitor according to the prior art.
Figure 2:
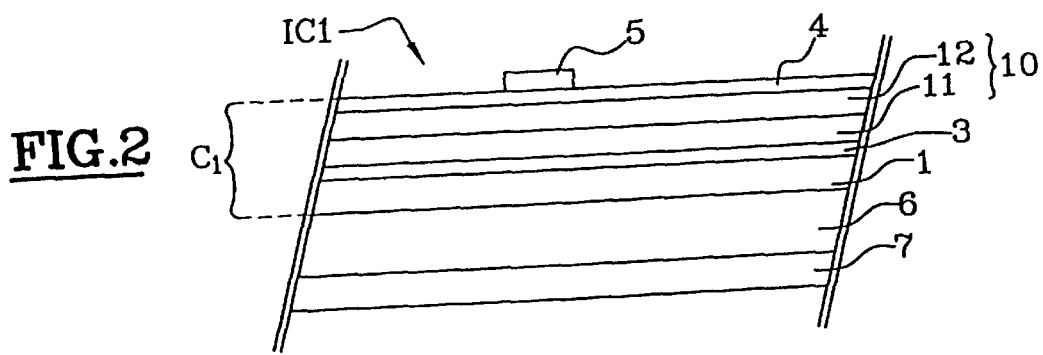
FIG. 2 is a cross-sectional view of a first embodiment of an integrated capacitor according to the present invention.
Figure 3:
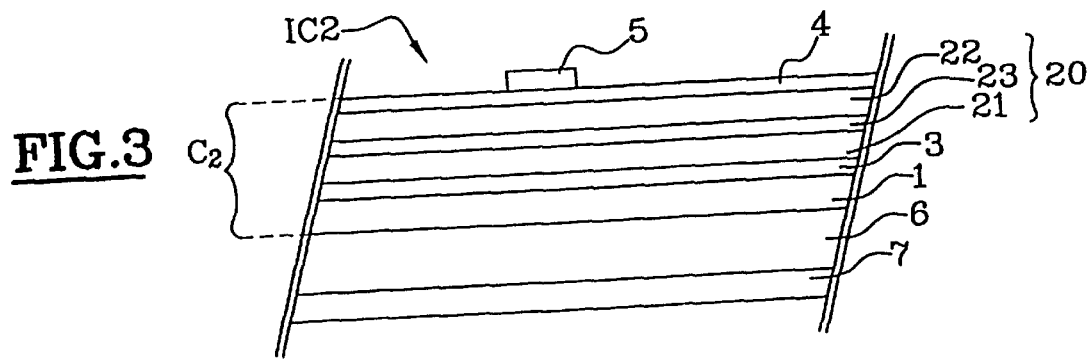
FIG. 3 is a cross-sectional view of a second embodiment of an integrated capacitor according to the present invention.
Figure 4:
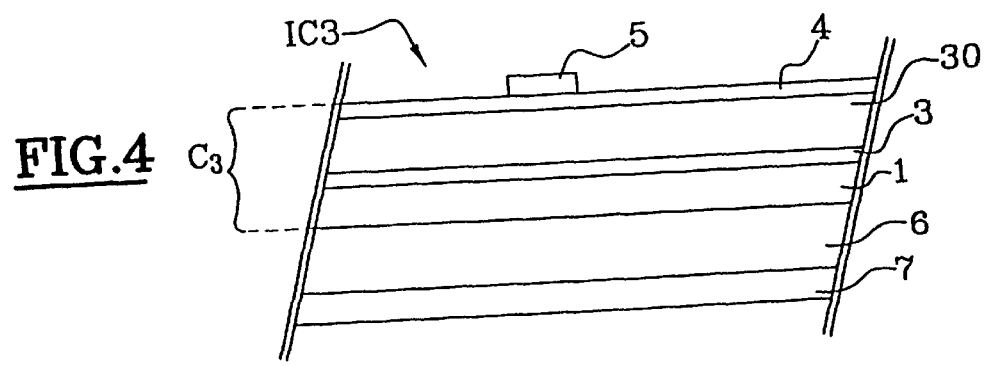
FIG. 4 is a cross-sectional view of a third embodiment of an integrated capacitor according to the present invention.

FIGS. 2, 3 and 4 show three capacitors $C_1$, $C_2$, $C_3$ according to the present invention. Like the capacitor $C_0$ described above, the capacitors $C_1$ to $C_3$ comprise a lower electrode 1 made of highly doped polysilicon, a thin oxide layer 3, a silicide layer 4 and a contact 5 which are made on a thick oxide layer 6 deposited on a silicon substrate 7. For simplicity, the references of these various elements are the same.

The capacitors $C_1$ to $C_3$ are distinguished from the capacitor $C_0$ by the fact that each of them has an upper electrode, respectively 10, 20 and 30; with a medium or weak dopant concentration at the interface with the silicide layer 4 and a high dopant concentration at the interface of the silicon oxide 3. Thus, these capacitors lend themselves well to the process of the silicide treatment of their upper electrode 10, 20 and 30 while, at the same time, providing high voltage linearity by the reduction of the depletion zone of polysilicon on the oxide 3 side.

More particularly, in FIG. 2, the electrode 10 of the capacitor $C_1$ has a lower layer of highly doped polysilicon 11 and an upper layer of weakly doped or medium doped polysilicon 12. For example, the layer 11 has a dopant concentration in the range of $1E^{20}$ to $2E^{20}$ atoms/cm$^3$ and the layer 12 has a concentration of about $4E^{20}$ to $8E^{20}$ atoms/cm$^3$. The dopant is conventionally arsenic or phosphorus. Each layer 11, 12 has a thickness of about 100 nanometers to form an electrode 10 that is a standard thickness.

In FIG. 3, the electrode 20 of the capacitor $C_2$ has two polysilicon layers 21, 22 separated by a thin metal layer 23. The layers 21, 22 are identical with the layers 11, 12 of the capacitor $C_1$. The thin metal layer 23, with a thickness of some tens of nanometers, such as 20 nanometers, for example. The thin metal layer 23 also comprises a metal or an alloy compatible with polysilicon, such as titanium Ti, tungsten W, cobalt Co or tantalum Ta, for example. According to one variation, the thin metal layer 23 has two thin layers of metals and/or alloys, such as a layer of titanium Ti and a layer of titanium nitride TiN, for example. In FIG. 4, the capacitor $C_3$ has a monolayer electrode 30 having a dopant concentration gradient ranging, for example, from $1E^{20}$ to $2E^{20}$ atoms/cm$^3$ on the silicon layer side 4 up to $4E^{20}$ to $8E^{20}$ atoms/cm$^3$ on the oxide layer 3 side.

Tables 1–3 describe the methods for the manufacture, respectively, of the capacitors $C_1$, $C_2$ and $C_3$. Conventionally, the various polysilicon layers are deposited by chemical vapor deposition (CVD) in a low pressure furnace at a temperature of about 600° C., and in the presence of a silicon compound such as silane. The silicide treatment of the electrodes 10 (layer 12), 20 (layer 22) or 30 is done in the presence-of a metal such as titanium Ti, cobalt Co, tungsten W, or tantalum Ta. The method comprises the steps of depositing metal, and annealing at moderate temperature, e.g., 700° C. for 30 seconds. The annealing step TA for the redistribution of the dopants is done, for example, at 1050° C. for 30 seconds. The rapid thermal annealing (RTA) or flash annealing step for the activation of the dopants is done, for example, at 1050° C. for 20 seconds.

TABLE 1

Making of a capacitor $C_1$ (FIG. 2)

$DP_1$-Deposition of the first polysilicon electrode 1
$II_1$-Ion implantation with high dose of arsenic or phosphorous
DO-Deposition of the oxide layer 3
$DP_2$-Deposition of the first layer 11 of the second polysilicon electrode 10
$DP_3$-Deposition of the second layer 12 of the second polysilicon electrode 10
$II_3$-implantation with moderate dose of arsenic or phosphorous
SI-Silicide treatment of the polysilicon layer 12
RTA-Flash annealing for the activation of the dopants

TABLE 2

Making of the capacitor $C_2$ (FIG. 3)

$DP_1$-Deposition of the first polysilicon electrode 1
$II_1$-Ion implantation with high dose of arsenic or phosphorous
DO-Deposition of the oxide layer 3
DP-Deposition of the first layer 21 of the second polysilicon electrode 20
$II_2$-ion implantation with high dose of arsenic or phosphorous
$DP_1$-Deposition of the first polysilicon electrode 1
DP-Deposition of the second layer 22 of the second polysilicon electrode 20
$II_3$-Ion implantation with moderate dose of arsenic or phosphorous
TA-Annealing for the redistribution of the implanted dopants
SI-Silicide treatment of the polysilicone layer 22
RTA-Flash annealing for the activation of the dopants

TABLE 3

Making of the capacitor $C_3$ (FIG. 4)

$II_2$-Ion implantation with high dose of arsenic or phosphorous
DO-Deposition of the oxide layer 3
TA-Annealing for the redistribution of the implantd dopants
DDP-Deposition of the second polysilicon electrode 30, with on-site doping in decreasing levels of concentration
SI-Silicide treatment of the second electrode 30
RTA-Flash annealing for the activation of the dopants In the first method (Table 1), the thermal annealing step TA is done after the deposition of the first electrode 1 and the first layer 11 of the second electrode 10. The thermal annealing is minimized after the deposition of the second layer 12 to prevent the migration of dopants from the layer 11 to the layer 12, which is the least doped layer. Only the flash annealing step RTA is achieved to activate the dopants. The annealing step RTA, which is brief, and the step of silicide treatment S at moderate temperature are not capable of causing any substantial redistribution of dopants between the layers 11 and 12. In the second method (Table 2), the annealing step TA is done after a deposition of three polysilicon layers. The thin metal layer 23 forms a barrier to the diffusion of dopants between the layers 21 and 22.

In the third method (Table 3), the TA annealing step is done after the deposition and ion implantation of the first electrode 1. There is no annealing step for the redistribution of the dopants supplied to the second electrode 30 which is doped in-situ. The deposition and doping of the electrode 30 are done simultaneously. The polysilicon growth is done in the presence of a dopant compound such as arsine or phosphine, while gradually reducing the partial pressure of dopant gas to obtain a decrease in dopant concentration. The RTA annealing and the step of silicide treatment SI are not capable of leading to a substantial redistribution of the dopants within the electrode 30.

As will be recognized by those skilled in the art, the choice of either of the electrodes such as 10, 20, and 30 according to the invention depends on the method of manufacture of the integrated circuit in which the capacitor is made. It depends, more particularly, on the point in time at which the annealing step TA for the redistribution of the dopants is carried out. FIGS. 2 to 4 are only partial views of integrated circuits, respectively $IC_1$, $IC_2$, $IC_3$, which comprises various other electronic components such as transistors, diodes, resistors, etc. The annealing steps TA enable the redistribution of dopants in the electrodes of the capacitor, but also all the silicon or polysilicon layers of the integrated circuit. Thus, the method of manufacture of the capacitor cannot be dissociated from the method for the batch manufacture of the other elements of the integrated circuit.

In general, from the foregoing description, the capacitor $C_2$ (FIG. 3) is suitable for all types of manufacturing methods, especially methods requiring that the TA annealing step should be carried out after the making of the upper electrode. The capacitors $C_1$ and $C_3$ have the advantage of being more simple to make, but require that the method for manufacturing the integrated circuit, after the making of the second electrode 10 or 20, should not have an annealing step or a thermal cycle that could lead to a redistribution of dopants.

Ultimately, those skilled in the art wishing to make a capacitor according to the invention will choose one of the three structures proposed above according to the manufacturing method considered for the entire integrated circuit, or will adapt the manufacturing process to the structure of the capacitor to be made. The development of manufacturing methods is lending towards a reduction of the annealing steps and it can be assumed that, in the future, $C_1$ or $C_2$ type capacitors may be provided in an increasing number of integrated circuits.

What is claimed is:

1. An integrated circuit capacitor comprising:
   a semiconductor substrate;
   a first electrode adjacent said semiconductor substrate;
   a dielectric layer overlying said first electrode;
   a second electrode overlying said dielectric layer; and
   a contact layer overlying said second electrode; said second electrode having a first dopant concentration at an interface with said dielectric layer greater than a second dopant concentration at an interface with said contact layer.

2. An integrated circuit capacitor according to claim 1, wherein said second electrode comprises a polysilicon layer having a dopant concentration profile that decreases from the interface with said dielectric layer towards the interface with said contact layer.

3. An integrated circuit capacitor according to claim 2, wherein the first dopant concentration is in a range of about $4E^{20}$ to $8E^{20}$ atoms/cm$^3$, and the second dopant concentration is in a range of about $1E^{20}$ to $2E^{20}$ atoms/cm$^3$.

4. An integrated circuit capacitor according to claim 1, wherein said second electrode comprises at least two polysilicon layers having different dopant concentrations.

5. An integrated circuit capacitor according to claim 4, wherein said at least two polysilicon layers comprises a first polysilicon layer having the first dopant concentration and a second polysilicon layer having the second dopant concentration.

6. An integrated circuit capacitor according to claim 5, wherein the first dopant concentration is in a range of about $4E^{20}$ to $8E^{20}$ atoms/cm$^3$ and the second dopant concentration is in a range of about $1E^{20}$ to $2E^{20}$ atoms/cm$^3$.

7. An integrated circuit capacitor according to claim 1, wherein said second electrode further comprises a metal layer separating the first and second dopant concentrations.

8. An integrated circuit capacitor according to claim 1, wherein said metal layer has a thickness less than about 20 nm.

9. An integrated circuit capacitor according to claim 7, wherein said metal layer comprises a metal selected from the group consisting of titanium, tungsten, cobalt and tantalum and alloys thereof.

10. An integrated circuit capacitor according to claim 7, wherein said metal layer comprises a first metal layer portion comprising a first metal and a second metal layer portion comprising a second metal different than the first metal.

11. An integrated circuit capacitor according to claim 10, wherein the first metal layer portion comprises titanium and the second metal layer portion comprises titanium nitride.

12. An integrated circuit capacitor according to claim 1, wherein said contact layer comprises silicide.

13. An integrated circuit capacitor according to claim 12, wherein the silicide comprises a metal selected from the group consisting of titanium, tungsten, cobalt and tantalum.

14. An integrated circuit capacitor according to claim 1, wherein said semiconductor substrate comprises silicon.

15. An integrated circuit capacitor according to claim 1, wherein said first electrode comprises polysilicon.

16. An integrated circuit capacitor according to claim 1, wherein said dielectric layer comprises silicon oxide.

17. An integrated circuit capacitor comprising:
   a semiconductor substrate;
   a first electrode adjacent said semiconductor substrate;
   a dielectric layer overlying said first electrode;
   a second electrode overlying said dielectric layer comprising a first polysilicon layer having a first dopant concentration adjacent said dielectric layer, and a second polysilicon layer having a second dopant concentration adjacent an upper surface of said second electrode, the first dopant concentration being greater then the second dopant concentration; and
   a contact layer overlying the upper surface of said second electrode.

18. An integrated circuit capacitor according to claim 17, wherein the first dopant concentration is in a range of about $4E^{20}$ to $8E^{20}$ atoms/cm$^3$ and the second dopant concentration is in a range of about $1E^{20}$ to $2E^{20}$ atoms/cm$^3$.

19. An integrated circuit capacitor according to claim 17, wherein said contact layer comprises silicide.

20. An integrated circuit capacitor according to claim 17, wherein the silicide comprises a metal selected from the group consisting of titanium, tungsten, cobalt and tantalum.

21. An integrated circuit capacitor according to claim 17, wherein said semiconductor substrate comprises silicon.

22. An integrated circuit capacitor according to claim 17, wherein said dielectric layer comprises silicon oxide.

23. A method for making an integrated circuit capacitor comprising the steps of:
   forming a first electrode adjacent a semiconductor substrate;
   forming a dielectric layer overlying the first electrode;
   forming a second electrode overlying the dielectric layer;
   forming a contact layer overlying the second electrode;
   and wherein the second electrode has a first dopant concentration at an interface with the dielectric layer greater than a second dopant concentration at an interface with the contact layer.

24. A method according to claim 23, wherein the step forming a second electrode comprises forming the second electrode comprising a polysilicon layer having a dopant concentration profile that decreases from the interface with the dielectric layer towards the interface with the contact layer.

25. A method according to claim 24, wherein the first dopant concentration is in a range of about $4E^{20}$ to $8E^{20}$ atoms/cm$^3$, and the second dopant concentration is in a range of about $1E^{20}$ to $2E^{20}$ atoms/cm$^3$.

26. A method according to claim 23, wherein the step forming a second electrode comprises forming the second electrode comprising at least two polysilicon layers having different dopant concentrations.

27. A method according to claim 26, wherein the at least two polysilicon layers comprises a first polysilicon layer having the first dopant concentration and a second polysilicon layer having the second dopant concentration.

28. A method according to claim 27, wherein the first dopant concentration is in a range of about $4E^{20}$ to $8E^{20}$ atoms/cm$^3$ and the second dopant concentration is in a range of about $1E^{20}$ to $2E^{20}$ atoms/cm$^3$.

29. A method according to claim 23, wherein the step forming a second electrode comprises forming a metal layer separating the first and second dopant concentrations.

30. A method according to claim 29, wherein the metal layer has thickness less than about 20 nm.

31. A method according to claim 29, wherein the metal layer comprises a metal selected from the group consisting of titanium, tungsten, cobalt, tantalum and alloys thereof.

32. A method according to claim 29, wherein the metal layer comprises a first metal layer portion comprising a first metal and a second metal layer portion comprising a second metal different than the first metal.

33. A method according to claim 32, wherein the first metal layer comprises titanium and the second metal layer comprises titanium nitride.

34. A method according to claim 23, wherein the contact layer comprises silicide.

35. A method according to claim 34, wherein the silicide comprises a metal selected from the group consisting of titanium, tungsten, cobalt and tantalum.

* * * * *